US009111669B2

(12) United States Patent
Auberger et al.

(10) Patent No.: US 9,111,669 B2
(45) Date of Patent: Aug. 18, 2015

(54) CONTROL PANEL WITH RESISTIVE KEYS AND PRESTRESSED SENSORS

(75) Inventors: Stephane Auberger, Strasbourg (FR); Roland Lobstein, Illkirch (FR)

(73) Assignee: Delphi Technologies, Inc., Troy, MI (US)

( * ) Notice: Subject to any disclaimer, the term of this patent is extended or adjusted under 35 U.S.C. 154(b) by 295 days.

(21) Appl. No.: 13/816,496

(22) PCT Filed: Aug. 2, 2011

(86) PCT No.: PCT/EP2011/063301
§ 371 (c)(1),
(2), (4) Date: Aug. 14, 2013

(87) PCT Pub. No.: WO2012/019944
PCT Pub. Date: Feb. 16, 2012

(65) Prior Publication Data
US 2013/0342307 A1    Dec. 26, 2013

(30) Foreign Application Priority Data
Aug. 12, 2010 (FR) ..................... 10 56578

(51) Int. Cl.
| | |
|---|---|
| *H01C 10/10* | (2006.01) |
| *H01C 10/00* | (2006.01) |
| *B60K 35/00* | (2006.01) |
| *G06F 3/045* | (2006.01) |
| *H01H 13/704* | (2006.01) |
| *H01H 13/705* | (2006.01) |
| *H03K 17/96* | (2006.01) |

(52) U.S. Cl.
CPC ............... *H01C 10/00* (2013.01); *B60K 35/00* (2013.01); *G06F 3/045* (2013.01); *H01H 13/704* (2013.01); *H01H 13/705* (2013.01); *H03K 17/9625* (2013.01); *B60K 2350/1036* (2013.01); *H01H 2217/004* (2013.01); *H01H 2217/024* (2013.01); *H01H 2231/026* (2013.01)

(58) Field of Classification Search
CPC ................. H01C 10/00; H01H 13/704; H01H 2217/004; H01H 2217/024; H03K 17/9622; G06F 3/045
USPC ................. 338/47; 200/293, 5 A, 341; 341/34
See application file for complete search history.

(56) References Cited

U.S. PATENT DOCUMENTS 4,220,815 A * 9/1980 Gibson et al. ............... 178/18.05
5,550,339 A * 8/1996 Haugh ......................... 200/5 A (Continued)

FOREIGN PATENT DOCUMENTS

EP    1 030 333 A1    8/2000

OTHER PUBLICATIONS

International Search Report dated Nov. 16, 2011.

*Primary Examiner* — Kyung Lee
(74) *Attorney, Agent, or Firm* — Lawrence D. Hazelton (57) ABSTRACT

A control panel comprising a cover that is equipped with at least one zone for detecting tactile contact forming a control button, in which a force sensor comprising a pressure-sensitive zone is arranged between the cover and the support so as to detect actuation of the control button, the force of the tactile contact being transmitted axially to the sensitive zone via a spacer plate made of an elastically compressible material that is inserted between the sensor and the cap, characterized in that the internal surface of the cap comprises a series of protruding elements that are distributed over the internal surface of the cap opposite the sensitive zone so as to form a number of regularly distributed zones of localized overpressure.

11 Claims, 5 Drawing Sheets

(56) References Cited

U.S. PATENT DOCUMENTS

| | | | |
|---|---|---|---|
| 6,750,408 B2 * | 6/2004 | Inoue et al. | 200/6 A |
| 8,153,920 B2 * | 4/2012 | Yau et al. | 200/512 |
| 2002/0185361 A1 | 12/2002 | Simon et al. | |
| 2006/0102462 A1 | 5/2006 | Bourdelais et al. | |
| 2006/0105146 A1 * | 5/2006 | Bourdelais et al. | 428/166 |
| 2006/0105152 A1 * | 5/2006 | Cok et al. | 428/209 |

* cited by examiner

CONTROL PANEL WITH RESISTIVE KEYS AND PRESTRESSED SENSORS

CROSS-REFERENCE TO RELATED APPLICATION

This application claims the benefit under 35 U.S.C. §371 of published PCT patent application number PCT/EP 2011/063301, filed Aug. 2, 2011, claiming priority to French patent application number FR1056578 filed on Aug. 12, 2010, and published as WO2012/019944 on Feb. 16, 2012, the entire contents of which is hereby incorporated by reference herein.

TECHNICAL FIELD OF INVENTION

The present invention relates to a control panel, in particular for a motor vehicle, having resistive keys.

BACKGROUND OF INVENTION

The present invention relates more particularly to a control panel intended to be arranged in the passenger space of a motor vehicle, in particular on the dashboard, and which includes at least one control button in the form of a resistive key designed to control a determined function, for example to control starting or stopping of the air-conditioning function.

The control panel includes a cover which is mounted on a support and which is provided with at least one detection zone designed to form a control button. A force sensor is arranged between the cover and the support, behind the detection zone, so as to produce an electrical control signal when a user applies a sufficient pressure force to the detection zone.

To compensate for the mechanical plays between the force sensor and the detection zone, it is known to arrange a spacing plate made of elastomeric material between the force sensor and the cover that must allow a direct transmission of the tactile pressure force to the force sensor via the spacing plate to be ensured under all circumstances. To this end, the spacing plate is mounted axially compressed between the force sensor and the cover.

To allow the detection of the tactile pressure, it is necessary for the thickness of the cover in the detection zone to be relatively small so as to allow a slight elastic deformation of the cover towards the sensor on tactile pressure. Now, the mounting of the spacing plate in compression between the sensor and the cover tends to cause a permanent outward deformation of the cover at the level of the spacing plate that degrades the external appearance of the cover. Moreover, the distribution of the pressure over the spacing plate is not even, the pressure generally being mainly on the outer peripheral edge of the spacing plate.

These disadvantages are particularly prejudicial in applications subject to large temperature variations, as in a motor vehicle, which can result in a loss of pressure on the spacing plate.

SUMMARY OF THE INVENTION

The present invention is intended to remedy the disadvantages mentioned above by proposing a simple, effective and economic solution.

To this end, the invention proposes a control panel, in particular for a motor vehicle, including a cover which is mounted on a support and which is provided with at least one zone for detection of a tactile pressure forming a control button, in which a force sensor having a zone sensitive to pressure is arranged between the cover and the support, behind the detection zone, so as to detect the actuation of the control button to produce an electrical control signal when a user applies a determined tactile pressure force to the detection zone, the tactile pressure force being transmitted axially to the sensitive zone via a spacing plate made of elastically compressible material which is inserted between the sensor and the cover, characterised by the fact that the inside surface of the cover includes a series of relief elements which are distributed over the inside surface of the cover opposite the sensitive zone so as to form a plurality of localised zones of increased pressure on the spacing plate, the said localised zones of increased pressure being uniformly distributed so that the spacing plate applies a substantially even pre-stressing force over the sensitive zone.

The invention is particularly advantageous as it allows mounting to be effected in which the residual axial pressure applied to the force sensor at rest, i.e. in the absence of tactile pressure, is lesser. Thus, the force sensor is mounted without excessive compression between its support and the cover with the spacing plate, which reduces the risks of distortion of the materials forming the assembly.

In the case of a force sensor operating with a prestress, the prestress produced by the pressure of the spacing plate on the sensitive zone of the sensor can be appropriately adjusted over the whole surface of the spacing plate by means of the relief elements, without having to apply a high pressure to guarantee that the prestress is sufficient.

In accordance with other advantageous characteristics of the invention: at least one of the relief elements has an axial thickness which varies in a transversal direction so as to compensate for the variations in intensity of the pressure force at rest of the cover on the spacing plate along the said transversal direction; the cover has a curved profile in the detection zone, and the axial thickness of the relief elements varies proportionally to the curvature of the cover relative to the support; the relief elements are separated from each other by interstitial spaces so as to allow sufficient flexion of the detection zone of the cover when a tactile pressure force is applied; the relief elements are formed of ribs; the relief elements are arranged in at least one line which is substantially parallel with the external outline of the sensitive zone; the relief elements are formed in one piece with the cover; the force sensor is of the type with detection of a variation in electrical resistance between conductive tracks; it includes a plurality of detection zones forming a plurality of control buttons associated with a plurality of force sensors, each force sensor including a spacing plate and a series of associated relief elements; the axial thickness of the relief elements is generally increasing in the transversal direction, from the periphery of the portion including the detection zones to a central part of the said portion; a small plate made of more rigid material than the material forming the spacing plate is inserted between the spacing plate and the sensitive zone of the sensor in order to contribute to even distribution of the prestressing force and the tactile pressure source over the sensitive zone of the sensor.

BRIEF DESCRIPTION OF DRAWINGS

Other characteristics, aims and advantages of the invention will become apparent on reading the following detailed description and taking into account the attached drawings, given as a non-limiting example and in which.

DETAILED DESCRIPTION

In the remainder of the description, identical or similar elements can be designated by identical references.

Figure 1:
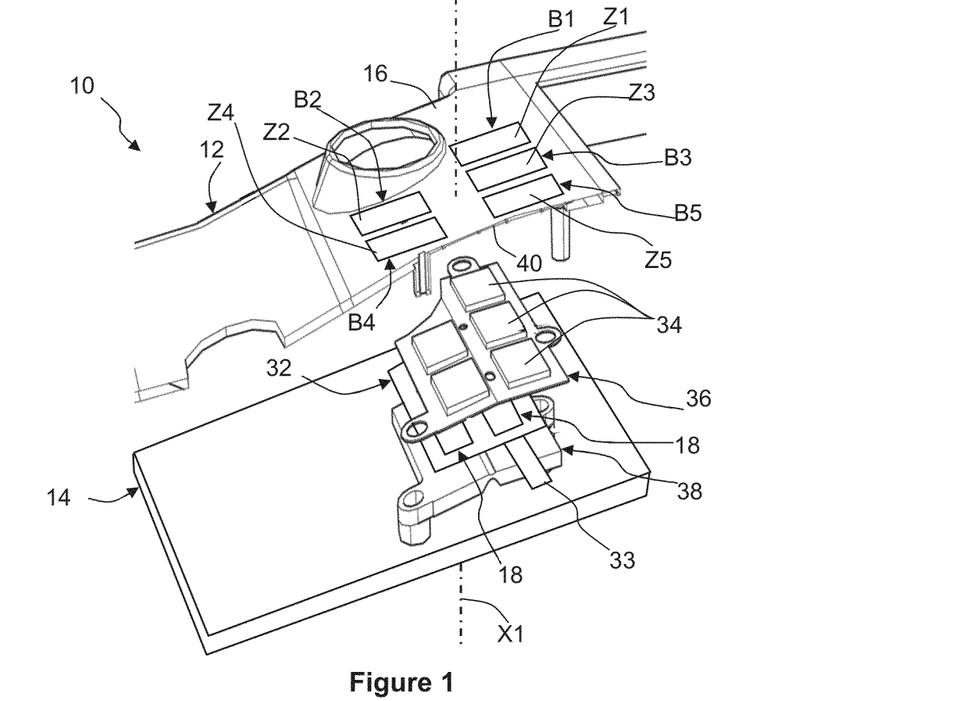
FIGS. 1 and 2 are exploded perspective views which show diagrammatically a control panel fitted with resistive keys provided with force sensors and with spacing plates in accordance with a first embodiment of the invention.
Figure 2:
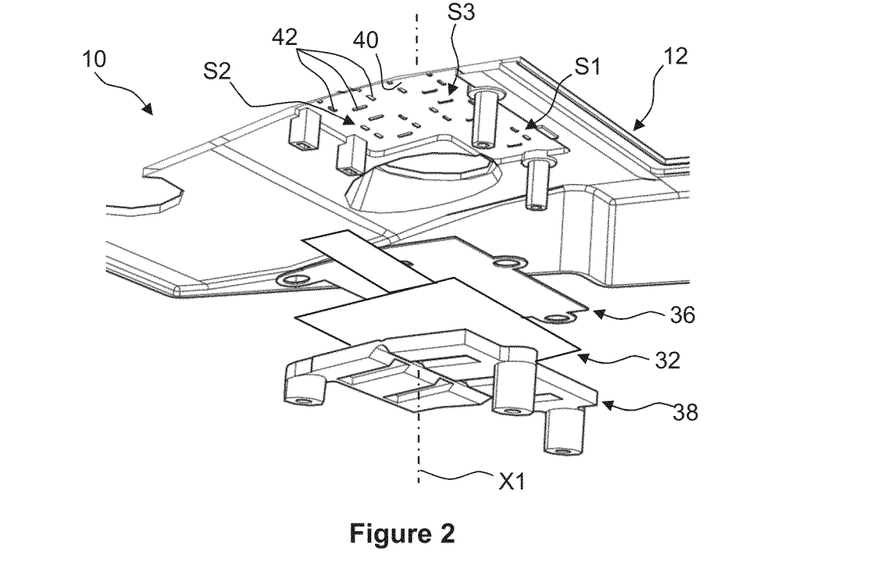

FIGS. 1 and 2 show a control panel 10 for a motor vehicle dashboard formed in accordance with a first embodiment in accordance with the teachings of the invention. It here includes a cover 12 which is mounted on a support 14, the outside surface 16 of the cover 12 including a plurality of detection zones Z1, Z2, Z3, Z4, Z5 of a tactile pressure forming a plurality of control buttons B1, B2, B3, B4, B5, or resistive keys.

In the remainder of the description, an axial orientation will be used in non-limiting manner along an axis X1 substantially at right-angles to the general plane of the cover 12, orientated from the bottom towards the top, i.e. from the support 14 towards the outside surface 16 of the cover 12, which generally corresponds to an orientation from the bottom towards the top considering FIGS. 1 and 2.

Each control button B1, B2, B3, B4, B5 here includes a force sensor 18 that is arranged between the cover 12 and the support 14, behind and axially opposite the associated detection zone Z1, Z2, Z3, Z4, Z5. Each force sensor 18 is designed to detect the actuation of the associated control button B1, B2, B3, B4, B5 to produce an electrical control signal when a user applies a tactile pressure force of sufficient intensity to the associated detection zone Z1, Z2, Z3, Z4, Z5.

In accordance with an advantageous characteristic of the invention, each force sensor 18 is of the type with resistance variable as a function of the force, for example of the FSR (force sensing resistor) type as described and illustrated in the documents US2006/0007172A1 and WO2009/070503A1 which are incorporated here by reference.

Figure 3:
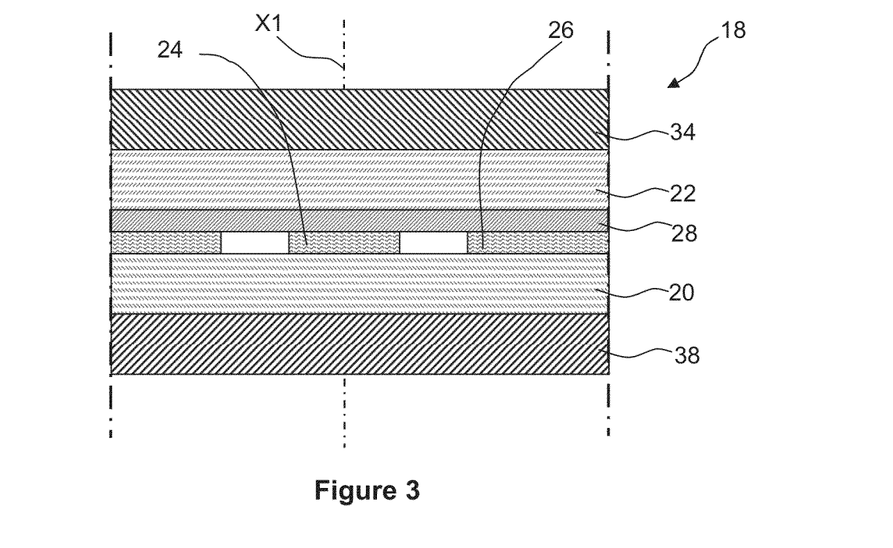
FIG. 3 is a partial view in axial section which shows diagrammatically the structure of a force sensor with which the control panel of FIGS. 1 and 2 is fitted.
Figure 4:
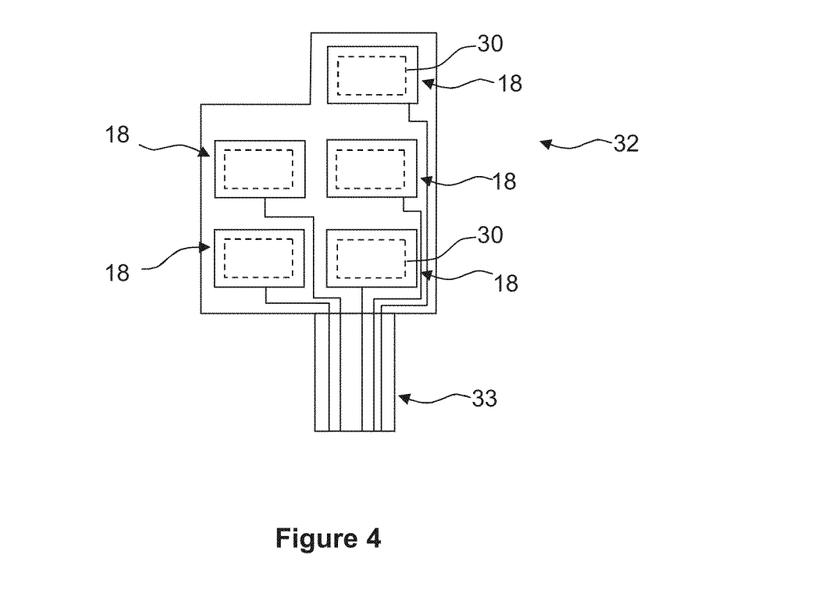
FIG. 4 is a view from above which shows diagrammatically a film carrying a plurality of force sensors designed to be fitted to the control panel of FIGS. 1 and 2.

Preferably, a force sensor 18 mounted under mechanical prestress is used here, as has been shown in FIGS. 3 and 4. The force sensor 18 here includes a first 20 and a second 22 substrate at least one of which is flexible when a tactile pressure force is applied to the associated detection zone Z1, Z2, Z3, Z4, Z5. Electrical conductive tracks 24, 26 are arranged, for example in the form of interdigitated combs, on a face of the first substrate 20 opposite a resistive coating 28 arranged on the opposite face of the second substrate 22, so as to define a zone sensitive to pressure 30 which is generally superimposed on the associated detection zone Z1, Z2, Z3, Z4, Z5. In the rest state of the force sensor 18, in the absence of tactile pressure force, the resistive coating 28 is in electrical contact with portions of conductive tracks 24, 26.

Advantageously, the five control buttons B1, B2, B3, B4, B5 being positioned in substantially adjacent manner on the cover 12, it is possible to arrange the five associated force sensors 18 on the same substrate 20, 22. Thus, as shown in FIGS. 1, 2, and 4, the force sensors 18 are in the form of a film 32 including an electrical connection ribbon 33 designed to allow the connection of the five sensors 18 to an electronic control unit (not shown).

In accordance with the embodiment shown, a spacing plate 34 made of elastically compressible material is mounted between each sensor 18 and the cover 12, opposite the detection zone Z1, Z2, Z3, Z4, Z5 so as to take up the mechanical plays between the sensor 18 and the cover 12. Preferably, the five spacing plates 34 provided for the five sensors 18 are all formed by molding in a same plate 36 made of silicone or of elastomeric material.

It will be noted that, due to the rigidity of the cover 12 in the detection zone Z1, Z2, Z3, Z4, Z5, the operating plays, i.e. the axial displacements of the cover 12 in the detection zone, can be less than the mechanical plays. The spacing plate 44 therefore allows the mechanical plays to be taken up to allow the detection of the axial displacements X1 of the cover 12 due to tactile pressures.

In accordance with the embodiment shown, an intermediate plate 38 is arranged between the support 14 of the cover 12 and the film 32 carrying the force sensors 18. The intermediate plate 38, which is fixed on the support 14, forms a support for the force sensors 18. It is preferably made from a sufficiently rigid material, for example polycarbonate (PC) or methyl polymethacrylate (PMMA) to allow the mounting of the force sensors 18 in prestress, i.e. to allow the force sensors 18 to be axially compressed between the intermediate plate 38 and the cover 12 with interposition of the small plate 36 between the force sensors 18 and the cover 12.

In accordance with the teachings of the invention, the inside surface 40 of the cover 12 includes a series S1, S2, S3, S4, S5 of relief elements 42 which are distributed over the inside surface of the cover 12, opposite the sensitive zone 30, so as to form a plurality of localized zones of increased pressure 44 on the spacing plate 34, as will be explained in more detail in relation to FIGS. 7 and 8 and with the second embodiment shown in FIG. 5.

Figure 5:
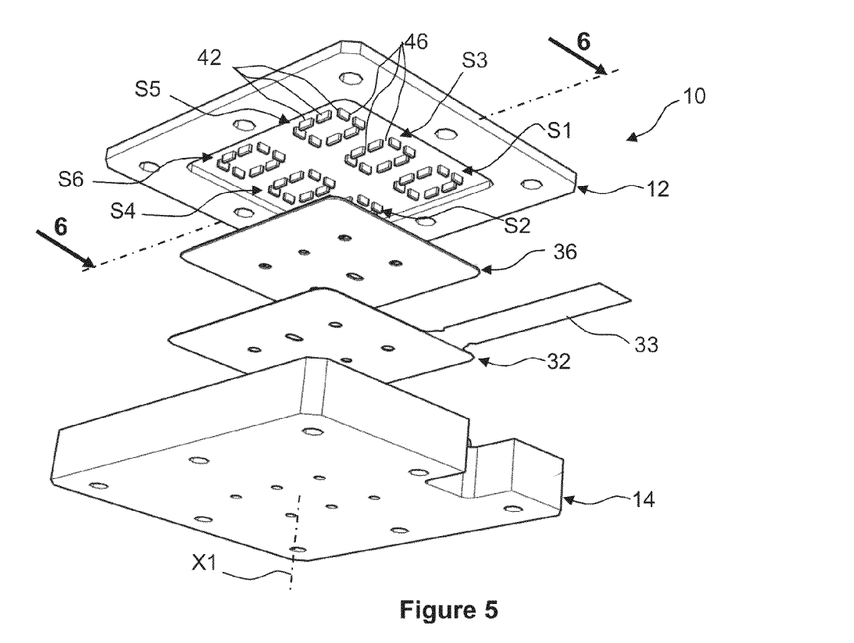
FIG. 5 is an exploded perspective view which shows diagrammatically a second embodiment of a control panel in accordance with the teachings of the invention.
Figure 6:
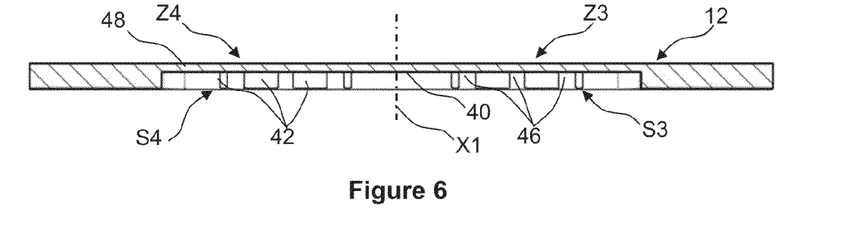
FIG. 6 is a view in axial section through the plane 6-6 of FIG. 5 which shows diagrammatically the cover of the control panel of FIG. 5 and the relief elements with which it is fitted.

FIGS. 5 and 6 show diagrammatically a second embodiment of the control panel 10 in accordance with the invention in which the mounting of the force sensors 18 is simplified because the film 32 provided with the force sensors 18 rests directly on the upper face of the support 14. Moreover, the general shape of the control panel 10 is here generally parallelepipedal which allows the characteristics of the invention to be revealed. Of course, the control panel 18 could adopt any shape suited to its arrangement in the passenger space of a vehicle.

In the example embodiment shown, the control panel 10 includes six detection zones Z1, Z2, Z3, Z4, Z5, Z6 and therefore six series S1, S2, S3, S4, S5, S6 of associated relief elements 42. The detection zones are here all identical and of rectangular shape. Of course, the control panel 10 could include detection zones of distinct shapes, these shapes having in particular to be suited to the ergonomic requirements of the controls.

Figure 7:
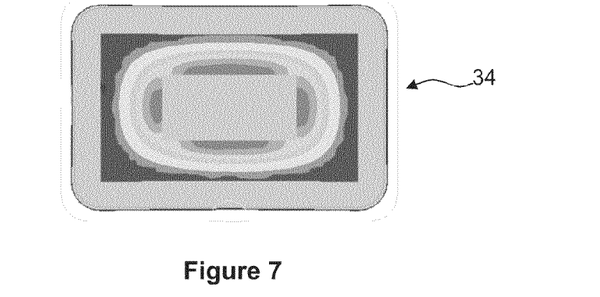
FIG. 7 is a diagram showing the distribution of the pressure applied by the cover to the spacing plate of a force sensor within the framework of a control panel of the prior art.
Figure 8:
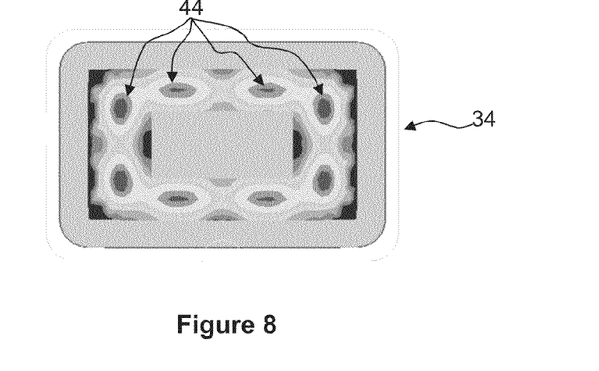
FIG. 8 is a diagram similar to that of FIG. 7 showing the distribution of the pressure applied by the cover to the spacing plate of a force sensor within the framework of a control panel in accordance with the second embodiment of the invention shown in FIG. 5.

FIG. 7 shows the distribution of the pressure applied by a conventional cover 12, having no relief elements, on a spacing plate 34 and FIG. 8 shows the distribution of the pressure applied by the cover 12 fitted with relief elements 42 in accordance with the invention on the spacing plate 34. As can be seen, in the case of the prior art, the pressure is mainly applied to the periphery of the spacing plate 34 and at four localized points in the proximity of the center of the spacing plate 34. Contrarily, in the case of the invention, the distribution of the pressure on the spacing plate 34 is better distributed due to the multiplicity of the relief elements 42 the positioning and distribution of which are so selected as to optimize the distribution of the pressure and thus allow the spacing plate 34 to apply a substantially even pressure over the sensitive zone 30 of the pressure sensor 18. Thus, in the example shown, the relief elements 42 are made in the form of ribs spaced apart from each other and arranged in a rectangular line substantially parallel with the rectangular outline of the spacing plate 34 and of the sensitive zone 30. Here there are eight ribs that produce eight localized zones of increased pressure 44.

Due to the distribution of the relief elements 42 and therefore the optimized distribution of the localized zones of increased pressure 44, the prestressing force applied by the spacing plate 34 to the sensitive zone 30 of the force sensor 18 is more even. The elasticity and the flexibility of the material forming the spacing plate 34 contribute to transmission and substantially even distribution of the prestressing force from the cover 12 and its relief elements 42 to the sensitive zone 30.

Advantageously, the interstitial spaces 46 between the relief elements 42 are designed to allow sufficient flexion of the detection zone Z1, Z2, Z3, Z4, Z5, Z6 of the cover 12 when a tactile pressure force is applied, preventing the relief elements 42 from making the cover 12 excessively rigid in the detection zone Z1, Z2, Z3, Z4, Z5, Z6.

The number and the dimensions of the relief elements 42 and of the interstitial spaces 46 can be adjusted depending on the pressure distribution and flexibility requirements of the detection zone Z1, Z2, Z3, Z4, Z5, Z6.

As can be seen in FIG. 6, the cover 12 includes a thin portion 48, here defining a rectangular zone in which the adjacent detection zones Z1, Z2, Z3, Z4, Z5, Z6 are arranged. This thin portion 48 offers a greater flexibility than the other zones of the cover 12 to allow the detection of the tactile pressures by the force sensors 18.

Due to the location of the fixing points of the cover 12 on the support 14 on the periphery of the thin portion 48 and due to the flexibility of this thin portion 48 which deforms, the pressure applied by the cover 12 to the spacing plates 34 tends to be higher at the periphery of the thin portion 48 relative to the center of the thin portion 48.

Figure 9:
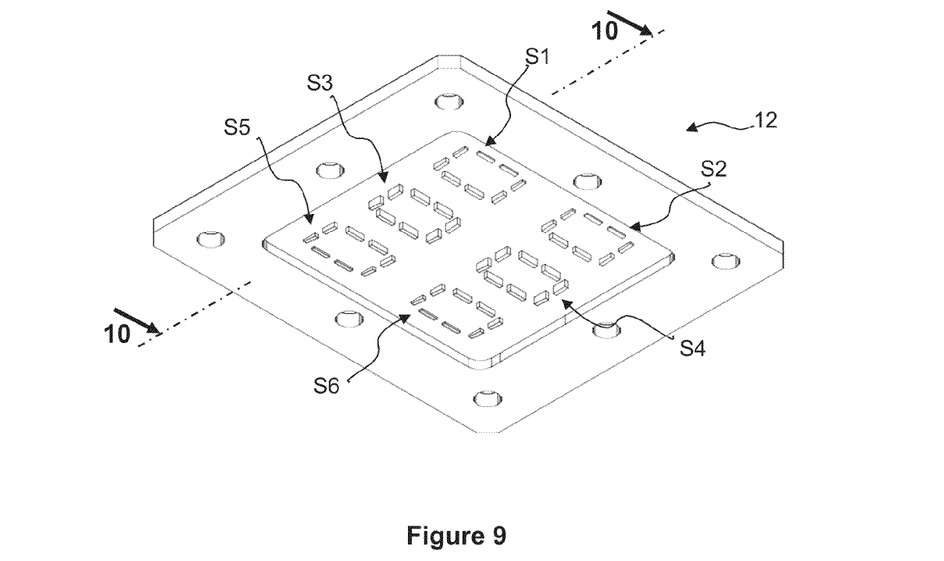
FIG. 9 is a perspective view from below of the cover of a control panel in accordance with a third embodiment in which the axial thickness of the relief elements varies.
Figure 10:
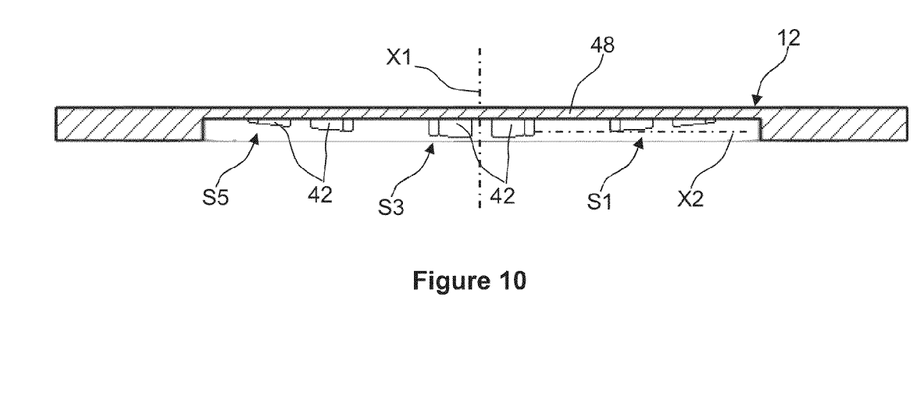
FIG. 10 is a view in axial section through the plane 10-10 of FIG. 9 which shows diagrammatically the cover of the control panel of FIG. 9.

Also, to further improve the evenness of the prestressing force on the force sensors 18, the invention proposes in a third embodiment shown in FIGS. 9 and 10, adjustment of the axial thickness of the relief elements 42 depending on their position relative to the periphery of the thin portion 48. Thus, considering the view in axial section of FIG. 10, it is found that in each series S1, S3, S5, the axial thickness of the ribs 42 is increasing in a transversal direction X2 from the periphery of the thin portion 48 to its center. This arrangement in accordance with the invention allows compensation for the pressure differences applied by the cover 12 to the spacing plates 34.

In accordance with a modified embodiment (not shown), the thickness of the relief elements 42 can also be adjusted so as to compensate for the effects of a curvature of the cover 12 in the case of a cover 12 having a particular non-rectilinear transversal profile.

Preferably, the relief elements 42 are made in one piece with the cover 12, for example by molding.

Figure 11:
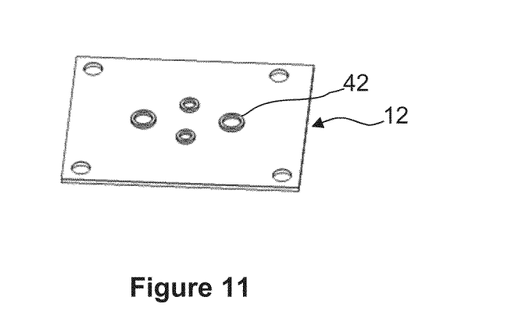
FIGS. 11 and 12 are perspective views from below of the cover of a control panel in accordance with modified embodiments in which the arrangement of the relief elements is different.
Figure 12:
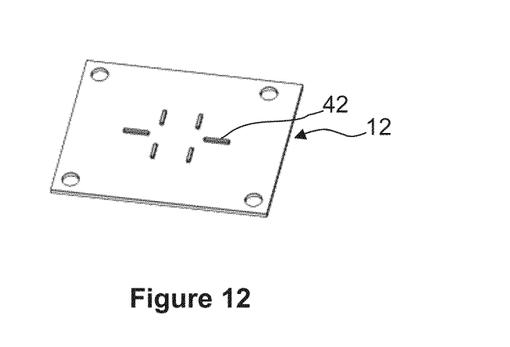

In accordance with modified embodiments, shown in particular in FIGS. 11 and 12, the relief elements 42 can have different forms, for example the form of ribs arranged in a circle, as in FIG. 11, or ribs arranged in a cross, as in FIG. 12.

The relief elements 42 could adopt forms other than ribs. However, the choice of ribs has the advantage of allowing easy manufacture, including by molding, while permitting a certain precision and great freedom in the positioning of the localized zones of increased pressure 44. Moreover, the ribs allow these effects to be obtained without causing detrimental stiffening of the cover 12 in the detection zones Z1, Z2, Z3, Z4, Z5, Z6.

Advantageously, to obtain a yet more uniform distribution of the pressure over the sensitive zone 30, each spacing plate 34 can be provided on its lower surface with a small plate made of material more rigid than the elastomeric material forming the spacing plate 34. The small plate is for example made of relatively rigid thermoplastic material, compared to the elastomeric material forming the spacing plate 34. The small plate can be made by overmolding with the said spacing plate 34. Each small plate extends generally over the whole area of the associated sensitive zone 30 to distribute the pressure over the whole of the sensitive zone 30.

The control panel 10 has been described here with a plurality of control buttons B1, B2, B3, B4, B5. Of course, the invention applies to the modified embodiments that would include a single control button or a different number of control buttons.

While this invention has been described in terms of the preferred embodiments thereof, it is not intended to be so limited, but rather only to the extent set forth in the claims that follow.

The invention claimed is:

1. A control panel suitable for a motor vehicle, said control panel including a cover mounted on a support, wherein said control cover defines at least one zone for detection of a tactile pressure to form a control button, wherein a force sensor that includes a zone sensitive to pressure is arranged between the cover and the support, and behind the detection zone so as to detect the actuation of the control button to produce an electrical control signal when a user applies a determined tactile pressure force to the detection zone, the tactile pressure force being transmitted axially to the sensitive zone via a spacing plate made of elastically compressible material which is inserted between the sensor and the cover, wherein the inside surface of the cover includes a series of relief elements distributed over the inside surface of the cover opposite the sensitive zone to form a plurality of localised zones of increased pressure on the spacing plate, the localised zones of increased pressure being uniformly distributed so that the spacing plate applies a substantially even prestressing force over the sensitive zone.

2. The control panel as described in claim 1, wherein at least one of the relief elements has an axial thickness that varies in a transversal direction so as to compensate for the variations in intensity of the pressure force at rest of the cover on the spacing plate along the said transversal direction.

3. The control panel as described in claim 2, wherein the cover has a curved profile in the detection zone, wherein the axial thickness of the relief elements varies proportionally to the curvature of the cover relative to the support.

4. The control panel as described in claim 1, wherein the relief elements are separated from each other by interstitial spaces so as to allow sufficient flexion of the detection zone of the cover when a tactile pressure force is applied.

5. The control panel as described in claim 1, wherein the relief elements are formed of ribs.

6. The control panel as described in claim 5, wherein the relief elements are arranged in at least one line which is substantially parallel with the external outline of the sensitive zone.

7. The control panel as described in claim 1, wherein the relief elements are formed in one piece with the cover.

8. The control panel as described in claim 1, wherein the force sensor is of the type with detection of a variation in electrical resistance between conductive tracks.

9. The control panel as described in claim 1, wherein it includes a portion including a plurality of detection zones forming a plurality of substantially adjacent control buttons associated with a plurality of force sensors, each force sensor including a spacing plate and a series of associated relief elements.

10. The control panel as described in claim 9, wherein the axial thickness of the relief elements is generally increasing in a transversal direction, from the periphery of the portion including the detection zones to a central part of the said portion.

11. The control panel as described in claim 1, wherein a small plate made of material more rigid than the material forming the spacing plate is inserted between the spacing plate and the sensitive zone of the sensor in order to contribute to an even distribution of the prestressing force and of the tactile pressure force over the sensitive zone of the sensor.

* * * * *